United States Patent [19]

Narayan et al.

[11] Patent Number: 5,208,182

[45] Date of Patent: May 4, 1993

[54] DISLOCATION DENSITY REDUCTION IN GALLIUM ARSENIDE ON SILICON HETEROSTRUCTURES

[75] Inventors: Jagdish Narayan, Raleigh, N.C.; John C. C. Fan, Chestnut Hill, Mass.

[73] Assignee: Kopin Corporation, Taunton, Mass.

[21] Appl. No.: 790,356

[22] Filed: Nov. 12, 1991

[51] Int. Cl.$^5$ .......................................... H01L 21/20
[52] U.S. Cl. .................................. 437/110; 437/126; 437/976; 148/DIG. 160
[58] Field of Search ................ 437/110, 107, 126, 976; 148/DIG. 160

[56] References Cited

U.S. PATENT DOCUMENTS

| | | | |
|---|---|---|---|
| 4,088,515 | 5/1978 | Blakeslee et al. | 437/976 |
| 4,561,916 | 12/1985 | Akiyama et al. | 437/126 |
| 4,963,508 | 10/1990 | Umeno et al. | 437/976 |

FOREIGN PATENT DOCUMENTS

| | | | |
|---|---|---|---|
| 332329 | 9/1989 | European Pat. Off. | 437/110 |
| 142116 | 5/1990 | Japan | 437/110 |

OTHER PUBLICATIONS

N. A. El-Masry, et al., "Combined effect of strained-layer supperlattice and annealing in defects reduction in GaAs grown on Si substrates", Applied Physics Letters 55 (14), 2 Oct. 1989, pp. 1442-1444.

C. Choi et al., Effect of in situ and ex situ annealing on dislocations in GaAs on Si Substrates, Appl. Phys. Lett. 50(15), 13 Apr. 1987, (pp. 992-994).

S. J. Pearton et al., Characterizations of GaAs Layers Grown Directly on Si Substrates by Metallorganic Chemical Vapor Deposition, J. Appl. Phys. 62(3), 1 Aug. 1987, (pp. 862-867).

J. W. Matthews et al., Defects in Epitaxial Multilayers, Journal of Crystal Growth, 27 (1974), pp. 118-125.

J. W. Matthews et al., Defects in Epitaxial Multilayers, Journal of Crystal Growth, 29(1975) pp. 273-280.

J. W. Matthews et al., Defects in Epitaxial Multilayers, Journal of Crystal Growth, 32(1976) pp. 265-273.

S. M. Bedair et al., Defect Reduction in GaAs Grown by Molecular Beam Epitaxy Using Different Superlattice Structures, Appl. Phys. Lett. 49(15), Oct. 13, 1986, pp. 942-944.

R. Fischer et al., Material Properties of High-Quality GaAs Epitaxial Layers Grown on Si Substrates, J. Appl. Phys. 60(5), Sep. 1, 1986, pp. 1640-1647.

El-Masry et al., Interactions of Dislocations in GaAs Grown on Si Substrates with InGaAsGaAsP Strained Layered Superlattices, J. Appl. Phys. 64(7), 1 Oct. 1988, 3672-3677.

Yamaguchi et al., Analysis of Strained-Layer Superlattice Effects on Dislocation Density Reduction in GaAs on Si Substrates, Appl. Phys. Lett., 54(1), Jan. 2, 1989.

Chu et al., Lattice-Mismatch-Generated Dislocation Structures and their Confinement Using Superlattices in Heteroepitaxial GaAs/InP and InP/GaAs Grown by Chemical Beam Epitaxy, J. Appl. Phys. 66(2), 15 Jul. 1989, pp. 520-530.

J. Narayan et al., Effect of Thermal Annealing in Boron Implanted, Laser Annealed Silicon, American Institute of Physics, 1979, pp. 440-445.

Lee et al., Epitaxy of GaAs on Si: MBE and OMCVD, Mat. Res. Soc. Symp. Proc., vol. 91, 1987, pp. 33-44.

Sharan et al., Strain Relief Mechanisms and the Nature of Dislocations in GaAs/Si Heterostructures, J. Appl. Phys. 66(6), 15 Sep. 1989, pp. 2376-2380.

Chang et al., Characteristics of Dislocations at Strained Heteroepitaxial InGaAs/GaAs Interfaces, J. Appl. Phys. 66(7), 1 Oct. 1989, pp. 2993-2998.

Primary Examiner—Brian E. Hearn
Assistant Examiner—Linda J. Fleck
Attorney, Agent, or Firm—Hamilton, Brook, Smith & Reynolds

[57] ABSTRACT

A method of forming gallium arsenide on silicon heterostructure including the use of strained layer superlattices in combination with rapid thermal annealing to achieve a reduced threading dislocation density in the epilayers. Strain energy within the superlattices causes threading dislocations to bend, preventing propagation through the superlattices to the epilayer. Rapid thermal annealing causes extensive realignment and annihilation of dislocations of opposite Burgers vectors and a further reduction of threading dislocations in the epilayer.

20 Claims, 8 Drawing Sheets

DISLOCATION DENSITY REDUCTION IN GALLIUM ARSENIDE ON SILICON HETEROSTRUCTURES

BACKGROUND

Gallium Arsenide (GaAs) offers many advantages over silicon (Si) in terms of increased speed and radiation hardness, and its ability to process and transmit optical signals. Silicon, on the other hand, is a well established material for integrated circuits and has superior mechanical and thermal characteristics. By growing epitaxial layers of GaAs on a Si substrate, it is possible to combine the advantages of both materials. Presently, GaAs/Si heterostructures grown by organometallic chemical vapor deposition (MOCVD) have defect densities of about $10^6$ cm$^{-2}$, compared with $10^2$–$10^3$ cm$^{-2}$ for silicon and $10^3$–$10^4$ cm$^{-2}$ for bulk GaAs. These heterostructures are adequate for some electronic device applications, but for high performance devices, such as light emitting diodes (LEDs) and lasers, defect densities at least of the order of $10^4$–$10^5$ cm$^{-2}$ or lower are required.

Threading dislocations and other defects in GaAs/Si heterostructures are primarily caused by lattice mismatch between the GaAs and Si layers ($a_{Si}$=5.43 A, $a_{GaAs}$=5.65 A), thermal mismatch (coefficient of thermal expansion $\alpha_{Si}$=2.6×10$^{-6}$k$^{-1}$, $\beta_{GaAs}$=5.8×10$^{-6}$K$^{-1}$, and growth related defects. Several methods have been employed to reduce the threading dislocation density in lattice mismatched epilayers such as the introduction of strained layer superlattices in the epilayer. A strained layer superlattice comprises an ordered arrangement of atoms of a first material disposed on a second material and forming a superimposed lattice on the lattice of the second material. The strain present in the superlattice is due to lattice mismatch between the two materials. In a structure employing a superlattice, the strain causes threading dislocations extending into the superlattice from a lower portion of the epilayer to bend. This bending prevents propagation through the superlattice to an upper portion of the epilayer. In one experiment, a GaAsP/GaAs strained layer superlattice was employed for dislocation density reduction in the growth of GaAs on a GaAs substrate. However, a need exists for new processes that will further reduce the density of dislocations in gallium arsenide on silicon structures.

SUMMARY OF THE INVENTION

The present invention relates to a method of forming a GaAs on Si heterostructure having a reduced threading dislocation density in the GaAs epilayer. In the method, strained layer superlattices are formed in the GaAs epilayer in combination with rapid thermal annealing of the heterostructure to achieve a reduced threading dislocation density in the epilayer. Strain energy within the superlattices causes threading dislocations to bend, preventing propagation through the superlattices to the epilayer. Rapid thermal annealing (RTA) involves isothermal annealing at a high temperature between 870°–930° C. for a period of time between 5 seconds and 2 minutes and preferably between 10–60 seconds. In the present invention, RTA is employed, preferably for about 10–60 seconds and at a temperature of between about 870° to 930° C., causing an extensive reduction of dislocations and, in particular, a further reduction of threading dislocations in the epilayer.

A GaAs/Si heterostructure formed using the method of the present invention includes a first GaAs layer formed over a Si substrate. A first strained layer superlattice is formed over the first GaAs layer and comprises alternating layers of a first material and a second material. An upper GaAs layer is formed over the first superlattice, and the entire heterostructure is subjected to rapid thermal annealing.

The first superlattice is preferably formed of alternating In$_x$Ga$_{1-x}$As strained layers and GaAs layers. Each strained layer contains strain energy due to the lattice mismatch between the In$_x$Ga$_{1-x}$As and GaAs layers which is related to the thickness of the strained layers. A critical thickness has been determined and corresponds to the minimum thickness of a strained layer which is capable of bending threading dislocations. Accordingly, each strained layer of the first superlattice has a thickness greater than the critical thickness such the strain energy within the strained layers is sufficient to cause bending of threading dislocations.

In accordance with another aspect of the present invention, additional strained layer superlattices may be employed in the GaAs/Si heterostructure to achieve further threading dislocation density reduction. To accomplish this, a plurality of alternating GaAs layers and strained layer superlattices are formed over the first strained layer superlattice. Preferably, the additional superlattices are identical to the first superlattice.

The effectiveness of strained layer superlattices for reducing threading dislocation density has been optimized with respect to the number of superlattices employed, the thickness of the individual layers of the superlattices, the position of each superlattice and the number of periods of the superlattices. For example, a pair of 5 period In$_{0.3}$Ga$_{0.7}$As/GaAs (100A/300A) superlattices were situated in a GaAs/Si heterostructure at distances of 0.5 $\mu$m and 2.5 $\mu$m (respectively) from the GaAs/Si interface. The first strained layer superlattice located near the interface reduces the dislocation density in the high dislocation density region. However, the first superlattice is not fully effective in bending all of the dislocations, so the second superlattice located near the epilayer is employed to deflect most of the remaining dislocations. Alternatively, it was also determined that asymmetry in the strain distribution within a stack of layers of a superlattice is quite effective in bending threading dislocations.

Although the method of the present invention comprises rapid thermal annealing of the GaAs heterostructure for reducing threading defects, conventional furnace annealing is also effective in eliminating defects. However, conventional furnace annealing at high temperatures is not very desirable for GaAs heterostructures for several reasons. The long term annealing process (>0.5 h) requires arsine overpressure during annealing to maintain stoichiometry of gallium arsenide. Arsenic has a much higher vapor pressure than gallium and tends to evaporate from the GaAs surface, leaving droplets of gallium metal on the surface. This will adversely affect device performances and should be avoided. The long time required for conventional furnace annealing also allows for more cross-diffusion of GaAs and Si across the GaAs/Si heterointerface, which is also undesirable. Further, conventional furnace annealing often requires a capping layer over the epilayer which can introduce stress at the GaAs/Si heterostructure. Thus, potential advantages of rapid thermal annealing over conventional furnace annealing include: shorter annealing periods (10-60s) compared to those for conventional furnace annealing (30-60 min), reduced dopant and background impurity diffusion during annealing, capless annealing which eliminates stress at the heterointerface and AsH3 overpressure is not necessary. These and other features of the present invention will be described in connection with the drawings.

DETAILED DESCRIPTION OF THE INVENTION

Dislocations are linear defects which cannot end inside a perfect lattice and therefore, extend throughout large regions of a crystal structure operating to degrade the performance of semiconductor devices in which they occur. Dislocations provide traps and recombination centers for carriers, thus adversely affecting carrier mobility and number density.

Dislocations are characterized by their sense vector, Burgess vector and slip plane (see Wolfe et al., "Physical Properties of Semiconductors," Prentice Hall (1989), Pg. 95). The sense vector indicates the direction along which the deviation from crystal periodicity occurs. The Burgers vector represents the direction and displacement of the dislocated region compared to a perfect crystal. It is determined by first taking a closed circuit around the atoms in a perfect region of the crystal and then taking the same circuit around a dislocated region. The vector required to close the circuit around the dislocated region is the Burgers vector. The slip plane is the plane along which a dislocation can move under applied stress, so it contains both the sense vector and the Burgers vector.

Figure 1:
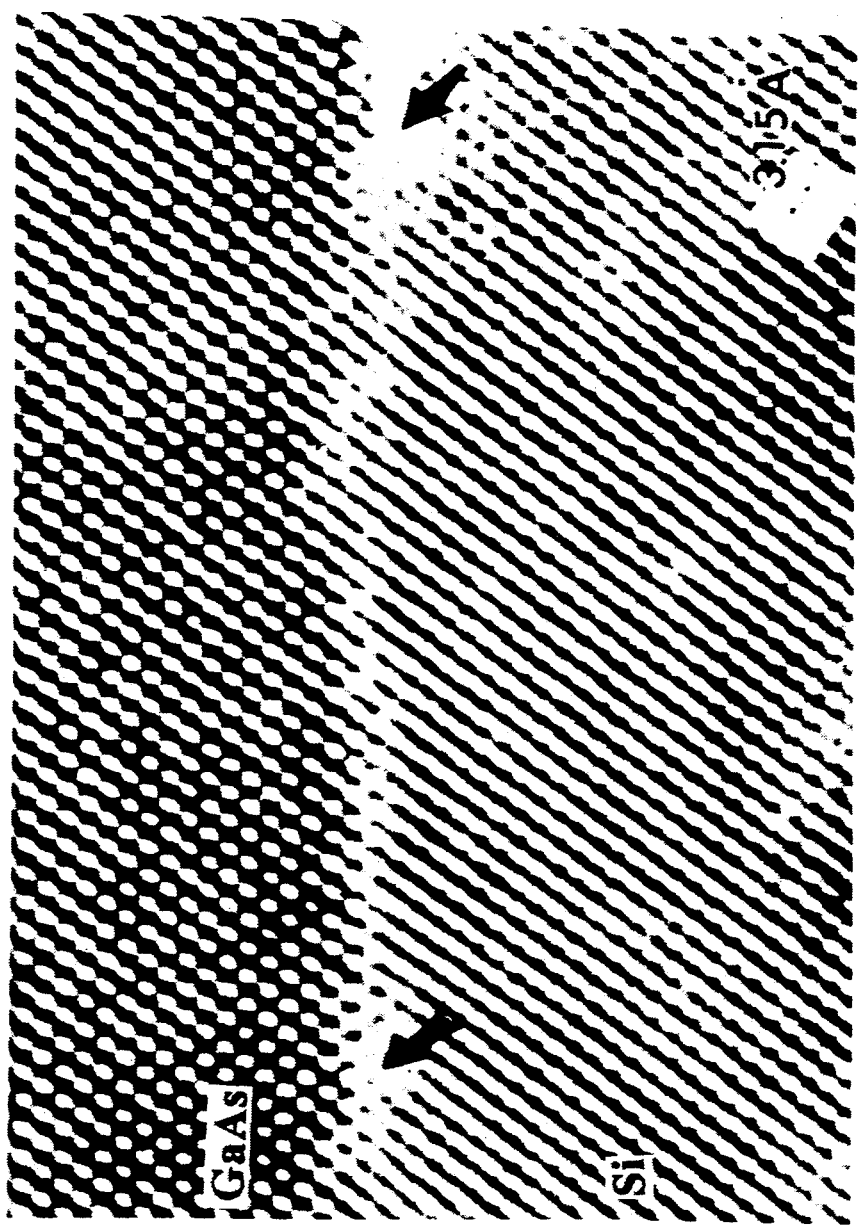
FIG. 1 is a high resolution electron micrograph cross-section of a portion of a GaAs/Si heterostructure showing dislocations at the GaAs/Si interface.

Referring to FIG. 1, a high resolution transmission electron micrograph of a <110> cross-section of a GaAs/Si heterostructure is provided. The GaAs epilayers 12 were grown by OMCVD on (001) Si 10 with a slight off-axis tilt. The strain energy of the structure increases with increasing epilayer thickness, and dislocation sources are activated to relieve the strain. The high resolution image shows the presence of two types of dislocations at the GaAs/Si heterointerface. The first type of dislocation has its Burgers vector parallel to the heterointerface, while the Burgers vector of the second type is inclined at an angle of about 45° to the heterointerface. Both types of dislocations have the same type Burgers vectors (a/2<110>), but different sense vectors. The Burgers vector of the first type of dislocations is perpendicular to the sense vector, indicating a pure edge dislocation (90° dislocation). The Burgers vector of the second type of dislocation makes a 60° angle with the sense vector, indicating a mixed character dislocation (60° dislocation). The 60° dislocations glide into the epilayer and move along each of the four inclined {111} slip planes toward the heterointerface. It is these dislocations in the GaAs epilayer which the method of the invention is aimed at reducing.

Figure 2:
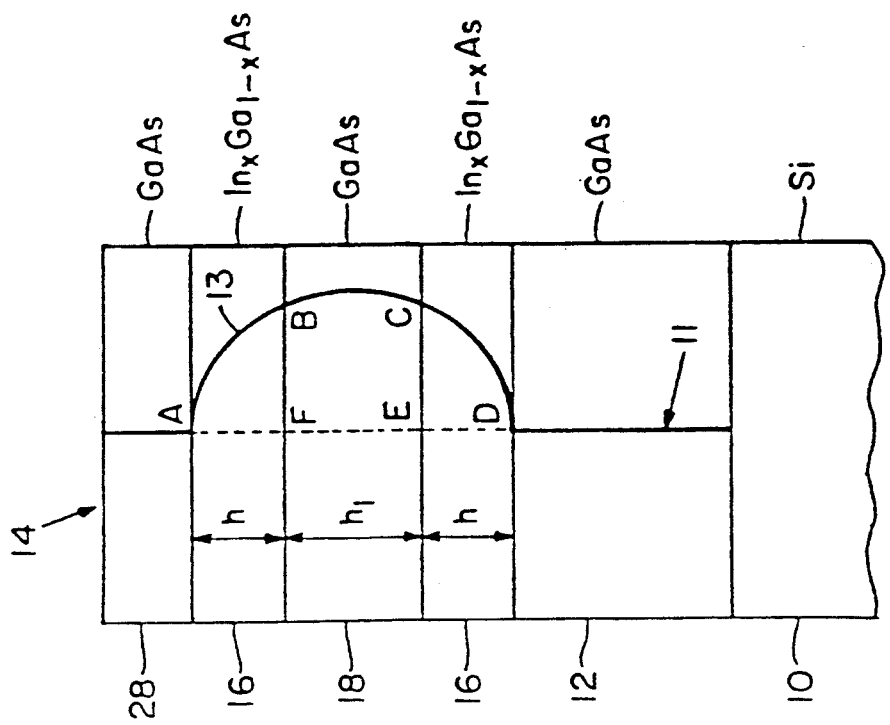
FIG. 2 is a schematic cross-sectional view of a threading dislocation bending due to the strained layer superlattice.

In the present invention, $In_xGa_{1-x}As$/GaAs strained layer superlattices (SLS's) are employed to reduce threading dislocations in the GaAs epilayer of a GaAs/Si heterostructure. Referring to FIG. 2, a heterostructure having a three period SLS 14 is provided. The SLS 14 has energy stored in strained layers 16 which interacts with 60° threading dislocation 11. When the strain energy is large enough, the threading dislocation 11 bends into a half loop configuration 13 and eventually forms a segment of a misfit dislocation. As such, the dislocation 11 is prevented from propagating into the GaAs epilayer 28, thereby reducing the threading dislocation density in the epilayer.

Each strained layer 16 contains strain energy due to the lattice mismatch between the $In_xGa_{1-x}As$ layers 16 and the GaAs layers 12 and 18. This strain energy is related to the thickness of each strained layer. A model based on energy considerations has been developed to characterize the critical thickness of each strained layer which corresponds to the minimum thickness of a strained layer capable of bending threading dislocations. The energy terms used in developing this model include the self energy of a dislocation half loop ($E_s$), the work expended as the straight threading dislocation 11 goes through a half loop ($E_w$) and the coherent strain energy stored in each strained layer ($E_c$). Assuming all of the strain energy is stored in the $In_xGa_{1-x}As$ layers, the self energy of the dislocation loop is given by:

$$E_s = \frac{(2-\nu)\mu b^2}{8(1-\nu)} r \left[ \ln\left(\frac{\alpha r}{b}\right) - 2 \right] \quad (1)$$

where μ is the shear modulus, b the Burgers vectors of the half loop, ν the Poisson's ratio and α is related to the dislocation core cut-off radius (the distance from the core center below which elastic theory does not apply), $r_o$. The value of α is taken to be 4 for covalent semiconductor structures. The work expended by the shear stress in the film is given by:

$$E_w = (Area\ of\ Loop) \tau b. \quad (2)$$

In equation (2), τ is the resolved shear stress in the glide plane calculated from $$\tau = \sigma \cos\phi \cos\lambda \quad (3)$$

where $\sigma$ is the stress arising due to the coherency strains and is given by $2\mu\{(1+\nu)/(1-\nu)\}\epsilon$ where $\epsilon$ is the misfit strain, $\phi$ is the angle between the slip plane normal and the stress axis and $\lambda$ is the angle between the stress axis and the slip direction. However, since the stresses due to the coherency strains are only in the $In_xGa_{1-x}As$ layers, the work is done only on the segments of the threading dislocation in the $In_xGa_{1-x}As$ layers. Hence, in equation (2) and as shown in FIG. 2:

$$Area\ of\ loop = Area\ of\ ABFA + Area\ of\ CDEC. \quad (4)$$

The energy of the half loop is then given by $$E_{half\ loop} = E_{self} - E_w. \quad (5)$$

The energy of that half loop reaches a maximum for a critical radius $r_c$, and decreases with further increase in the loop radius. This is the energy to be supplied by the coherent energy present in the $In_xGa_{1-x}As$ layers, if the threading dislocation is to form a misfit dislocation segment and relieve the lattice mismatch. The coherent energy per unit volume stored in the $In_xGa_{1-x}As$ layers is given by:

$$E_{coh} = K\epsilon^2, \quad (6)$$

where $K = \{2\mu(1+\nu)\}/(1-\nu)$ and the other symbols have the same meaning as defined earlier. The coherent energy is then obtained by multiplying the coherent energy per unit volume by the volume in which the coherent energy is stored. The volume of material in which the coherent energy is stored is $$V = (Area\ of\ ABFA + Area\ of\ CDEC) \times d$$

where d is the separation of misfit dislocations required for full strain relief and is given by:

$$d = b_{mis}/f$$

where $b_{mis}$ is the component of the Burgers vector of the misfit dislocation relieving the lattice mismatch and f is the mismatch. The coherent energy stored in the $In_xGa_{1-x}As$ layers supplies the energy required to overcome the activation energy for misfit dislocation formation. Referring to FIG. 2, as the threading dislocation 11 bends through a half loop 13, the coherent energy in the $In_xAs_{1-x}As$ layers is not relieved until the misfit dislocations lying in the (001) plane of the heterointerface are formed. Hence, the coherent energy stored in the $In_xGa_{1-x}As$ layers supplies the energy required for the threading dislocation to form a misfit dislocation segment.

Figure 3:
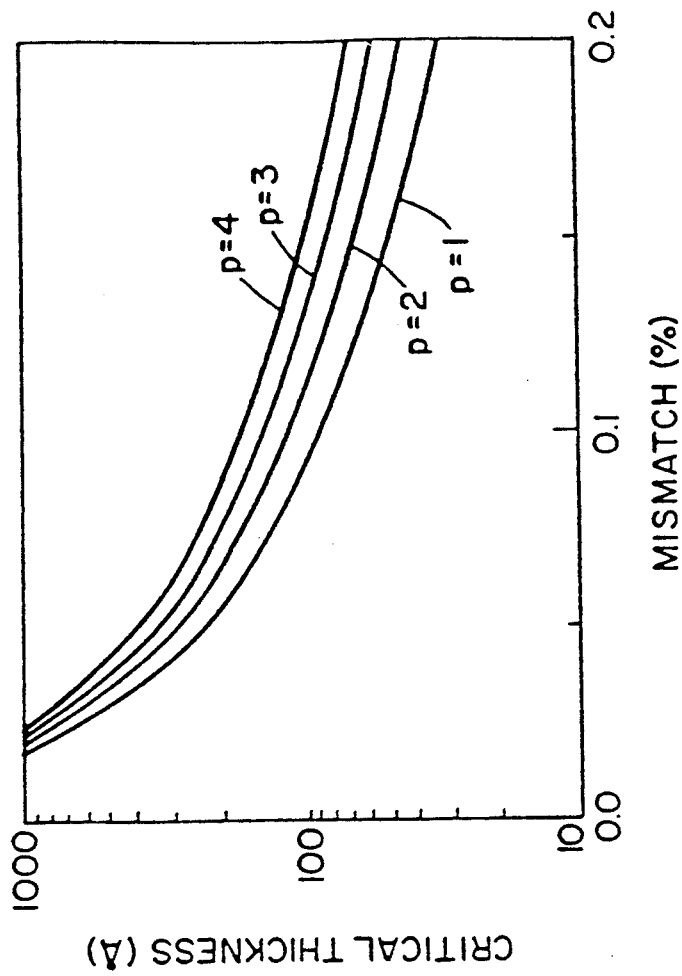
FIG. 3 is a graphical representation of the critical thickness for the strained layers of an $In_xGa_{1-x}As$/GaAs strained layer superlattice for bending of threading dislocations plotted as a function of lattice mismatch.

Referring to FIG. 3, the critical thickness for bending of dislocation is plotted as a function of the lattice mismatch for various values of p, where p is the ratio of the GaAs layer thickness ($h_1$) to the $In_xGa_{1-x}As$ layer thickness (h). As the value p increases, the intervening GaAs layer thickness increases and the thickness of the strained layers required for bending of dislocation increases. This is because on increasing p, the self energy of the dislocation half loop 13 increases, while the term representing the work done does not increase as rapidly, since there is no work done on the dislocation segment present in the GaAs layer 18. This implies that the energy of the half loop 13 increases and hence a larger thickness of the strained layers 16 is required to bend the threading dislocation.

Figure 4:
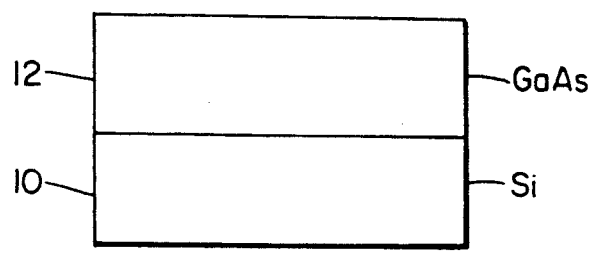
FIGS. 4–7 are successive schematic cross-sectional views of the method of forming a GaAs/Si heterostructure in accordance with the present invention.
Figure 5:
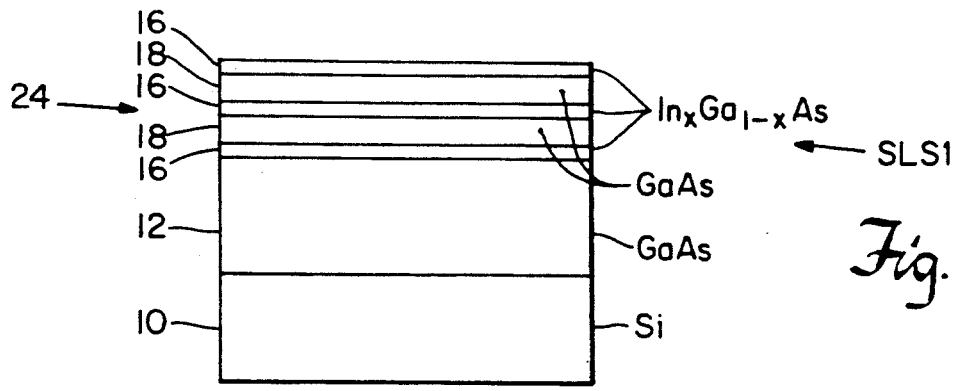
Figure 8:
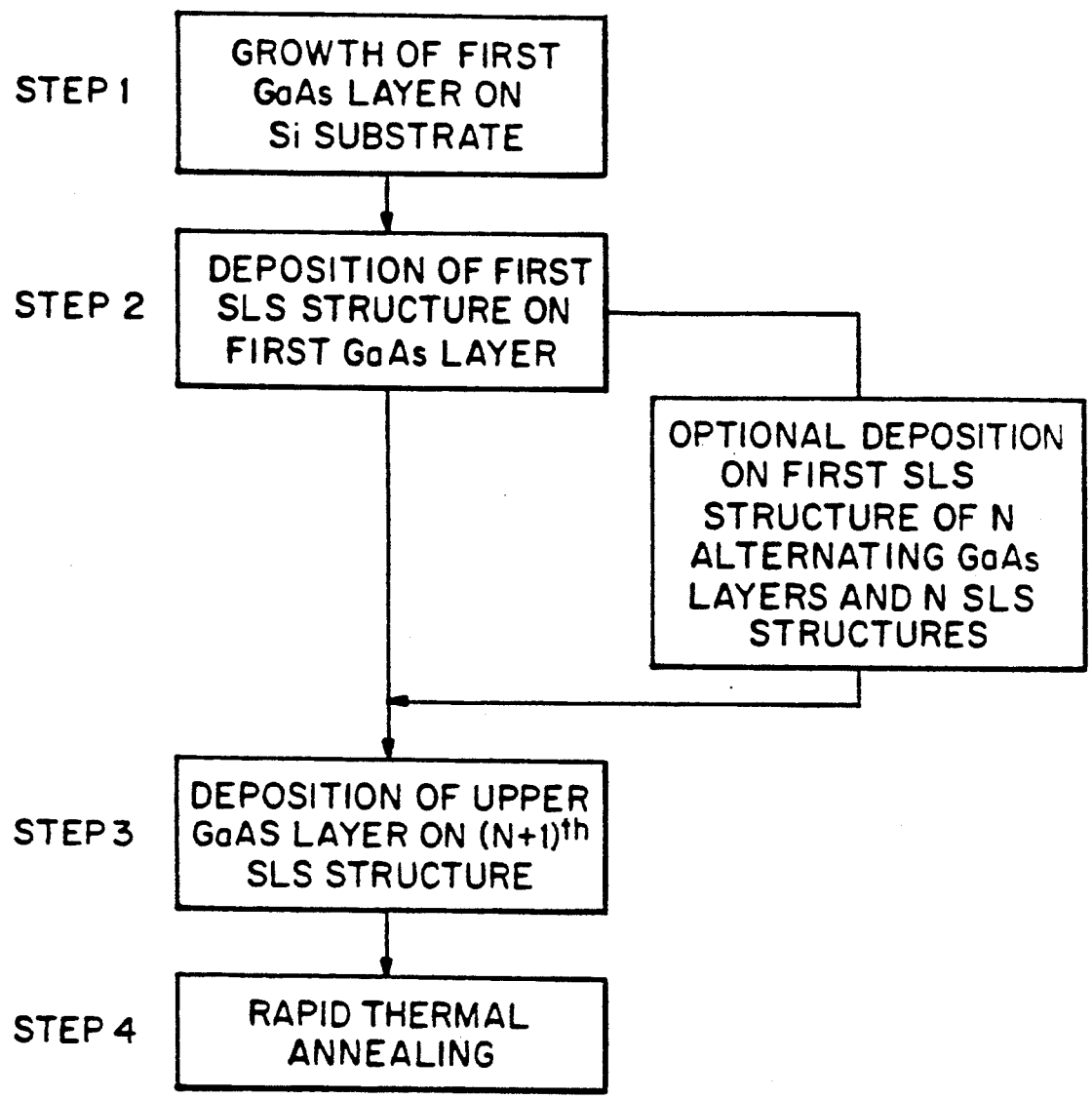
FIG. 8 is a process chart of the method of FIGS. 4–7.

In the successive view of FIGS. 4-7 and in the process chart of FIG. 8, the basic concepts of the method of the invention are shown. Referring to FIG. 4, a wafer is comprised of a single crystal Si substrate 10 upon which a lower GaAs layer 12 is formed (Step 1, FIG. 8). The GaAs layer 12 forms a lower portion of the GaAs epilayer. A first SLS 24 is formed, as by deposition, over the lower GaAs layer 12 (Step 2, FIG. 8 and FIG. 5). The SLS 24 is comprised of alternating $In_xGa_{1-x}As$ strained layers 16 and GaAs layers 18. The thickness of the strained layers is preferably greater than the critical thickness for the bending of dislocations, since the critical thickness is calculated for an equilibrium process. Additionally, there is some interdiffusion at the strained layer interfaces which reduces the mismatch and hence the strains present in the layers. Further, strain relaxation of the superlattices which occurs by the bending of threading dislocation into misfit segments does not take place completely at just above the critical thickness, but at thicknesses significantly greater than the critical thickness. Since most of the strain relaxation processes are over by the time 0.2 $\mu$m of the epilayer has been grown, the SLS layers (16 and 18) should be inserted after at least 0.2 $\mu$m of the lower GaAs layer 12 has been grown.

Figure 6:
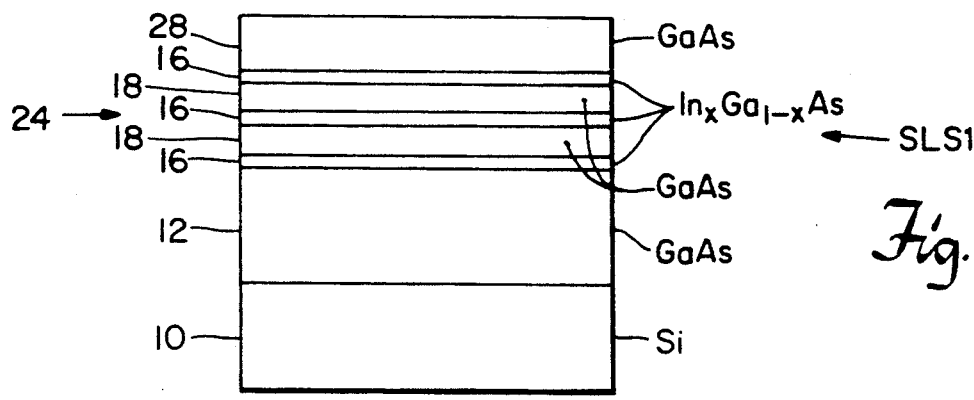
Figure 7:
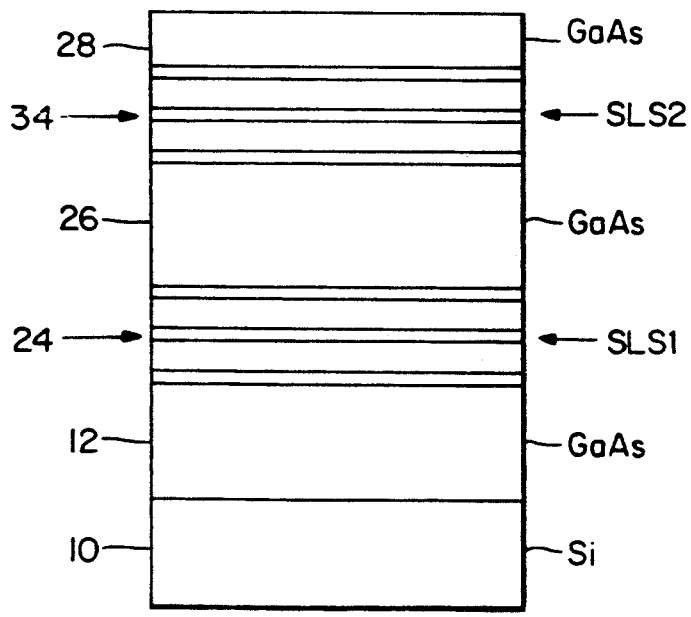

Referring to FIG. 6, an upper GaAs layer 28, which serves as the upper portion of the GaAs epilayer, is then formed over the SLS 24 (Step 3, FIG. 8). The heterostructure thus formed is then subjected to ex-situ rapid thermal annealing for a period ranging from about 10-60 seconds (Step 4, FIG. 8). The presence of the SLS 24 in the epilayer in combination with ex-situ rapid thermal annealing leads to a GaAs/Si heterostructure having a reduced threading dislocation density in the GaAs epilayer.

It has been determined that using multiple SLSs is more effective in reducing threading dislocations in a GaAs/Si heterostructure. Thus, additional SLSs separated by GaAs layers may be formed over the first SLS 24 (FIG. 8). For example, in FIG. 7 a second SLS 34 is formed over the first SLS 24, separated by GaAs layer 26. The upper GaAs layer 26 is formed over the second SLS 34, and the structure is subjected to ex-situ rapid thermal annealing.

Figure 9:
FIG. 9 is a cross-section electron micrograph of a portion of a GaAs/Si heterostructure showing a strained layer superlattice situated 0.5 μm from the GaAs/Si heterointerface.
Figure 10:
FIG. 10 is a cross-section micrograph of another portion of the GaAs/Si heterostructure of FIG. 9 showing a second strained layer superlattice situated 2.5 μm from the GaAs/Si heterointerface.

The effectiveness of SLS was optimized as a function of position in the epilayer, number of periods per SLS and thickness of individual layers of each SLS. To that end, FIGS. 9 and 10 show cross-sectional electron micrographs of a GaAs epilayer 40 on Si substrate 38 with two 5 period $In_{0.3}Ga_{0.7}As/GaAs$ (100A/300A) superlattices (42 and 44) situated at a distance of 0.5 $\mu$m and 2.5 $\mu$m from the GaAs/Si interface. The threading dislocations within the heterostructure are predominantly of 60° type. It is shown in the micrograph that there is an extensive bending of dislocations at the SLS interfaces. The first strained layer superlattice 42 close to the interface is used to initially reduce the dislocation density in the high dislocation density region. Since the dislocation density close to the interface is quite high, the SLS 42 is not fully effective in bending all the dislocations. However, as the thickness of the GaAs epilayer 40 is increased the dislocation density decreases and the superlattice 44 near the surface is effective in deflecting most of the remaining threading dislocations. Accordingly, FIG. 10 shows extensive bending of the dislocation layers at the upper SLS 44.

Figure 11:
FIG. 11 is a cross-section electron micrograph of a portion of a GaAs/Si heterostructure with three intervening strained layer superlattices.
Figure 12:
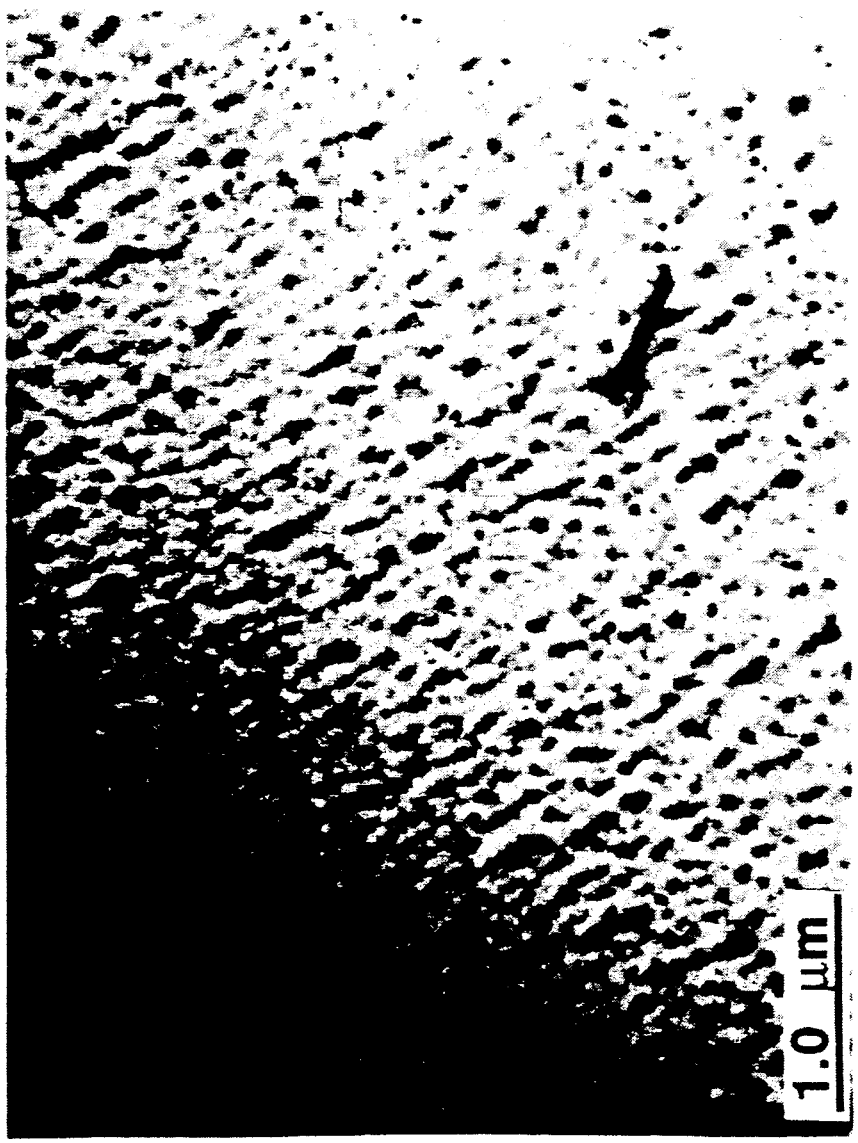
FIG. 12 is a plan view electron micrograph of the GaAs/Si heterostructure of FIG. 11.

Referring to FIG. 11, three $In_{0.3}Ga_{0.7}As$/GaAs SLSs 46 were employed in a GaAs epilayer 48 and produced extensive bending of threading dislocations at the SLS interfaces. Recall that rapid thermal annealing is defined as isothermal heating at a constant high temperature for a short period of time, where the short period may be of the order of 10-20 seconds instead of 20-30 minutes. The GaAs epilayer 48 with three superlattices (46, 47) was subjected to ex-situ rapid thermal annealing at 900° C. for 20 seconds. The first two SLSs 46 are 5 period 100A/300A $In_{0.3}Ga_{0.7}As$/GaAs structures. The third superlattice 47 is a 5 period 300A/300A $Al_{0.6}Ga_{0.4}As$/GaAs structure. FIG. 11 shows a cross-sectional electron micrograph from this sample. As can be seen, there has been extensive annihilation and realignment of the dislocations at the SLS interfaces, and a further filtering of threading dislocations. The increased mobility of the dislocations at the elevated temperatures leads to dislocation interactions to form complete loops as well as increased bending of dislocations at the SLS interfaces. FIG. 12 shows a plan view micrograph from the annealed sample and the dislocation density is estimated from the plan view micrographs to be about $5.0 \times 10^5$ cm$^{-2}$. The stack of layers of the asymmetric $Al_{0.6}Ga_{0.4}As$/GaAs superlattice, which contained higher strain farther from the interface as a result of compositional variations, was found to be more effective in bending the threading dislocations. The asymmetric strain distribution may also lead to coiling of dislocations, where dislocations after several turns within the superlattice bend toward the substrate. This process leads to an absolute reduction in dislocation density.

While this invention has been particularly shown and described, with references to preferred embodiments thereof, it will be understood by those skilled in the art that various changes in form and details may be made therein without departing from the spirit and scope of the invention as defined by the appended claims.

We claim:

1. A method of forming a gallium arsenide on silicon heterostructure comprising the steps of:
   forming a first gallium arsenide layer over a silicon substrate;
   forming a first strained layer superlattice over the first gallium arsenide layer, the strained layer superlattice comprising alternating layers of a first material and second material;
   forming an upper gallium arsenide over the first strained layer superlattice to form a layered structure; and
   subjecting the formed structure to rapid thermal annealing for about two minutes or less.

2. The method of claim 1 wherein the first material is $In_xGa_{1-x}As$ and the second material is gallium arsenide.

3. The method of claim 2 wherein each of the $In_xGa_{1-x}As$ layers has a thickness which is greater than a critical thickness.

4. The method of claim 1 wherein the first strained layer forming step further comprises forming a second gallium arsenide layer over first strained layer and forming a second strained layer superlattice over the second gallium arsenide layer, the second strained layer superlattice structure comprising alternating layers of the first material and the second material.

5. The method of claim 4 wherein the first strained layer superlattice is positioned 0.5 μm above the silicon substrate and the second strained layer superlattice is positioned 2.5 μm above the silicon substrate.

6. The method of claim 4 wherein the first material is $In_xGa_{1-x}As$ and the second material is gallium arsenide.

7. The method of claim 4 wherein each strained layer superlattice comprises three layers of the first material and two layers of the second material.

8. A method of claim 4 wherein the first strained layer forming step further comprises forming over the second strained layer superlattice a plurality of alternating gallium arsenide layers and strained layer superlattices, each of said plurality strained layer superlattices comprising of alternating layers of the first material and the second material.

9. A method of forming a gallium arsenide on silicon heterostructure comprising the steps of:
   forming a first gallium arsenide layer over a silicon substrate;
   forming a strained layer superlattice structure over the first gallium arsenide layer, the strained layer superlattice structure comprising a plurality of superlattices in which each superlattice includes alternating layers of $In_xGa_{1-x}As$ and gallium arsenide;
   forming an upper galium arsenide layer over the first strained layer superlattice structure; and
   subjecting the formed structure to rapid thermal annealing for about two minutes of less.

10. The method of claim 9 wherein rapid thermal annealing comprises heating for a period of time between 10 seconds and 60 seconds.

11. The method of claim 9 wherein each strained layer superlattice comprises three layers $In_xGa_{1-x}As$ and two layers of gallium arsenide.

12. The method of claim 9 wherein each of the $In_xGa_{1-x}As$ layers has a thickness which is greater than a critical thickness.

13. The method of claim 9 wherein each strained layer superlattice has $In_xGa_{1-x}As$ layers with a thickness of about 100 angstroms and gallium arsenide layers with a thickness of about 300 angstroms.

14. The method of claim 9 wherein each strained layer superlattice comprises alternating layers of $In_{0.3}Ga_{0.7}As$ and gallium arsenide.

15. The method of claim 9 wherein the first strained layer superlattice and a second strained layer superlattice are comprised of three layers of $In_{0.3}Ga_{0.7}As$ each having a thickness of about 100 angstroms and two layers of gallium arsenide each having a thickness of about 300 angstroms and a third strained layer superlattice is comprised of three layers of $Al_{0.6}Ga_{0.4}As$ each having a thickness of about 300 angstroms and two layers of gallium arsenide each having a thickness of about 100 angstroms.

16. A method of forming a gallium arsenide on silicon heterostructure comprising:
   forming a first gallium arsenide layer over a substrate;
   forming a first strained layer superlattice over the first gallium arsenide layer, the strained layer superlattice comprising alternating layers of a first material and a second material;
   forming an upper gallium arsenide layer over the first strained layer superlattice to form a layered structure; and
   heating the formed structure for a period of time in the range of 10 seconds to 60 seconds to anneal the structure.

17. The method of claim 16 wherein the first material comprises $In_xGa_{1-x}As$ and the second material comprises gallium arsenide.

18. The method of claim 16 further comprising forming a plurality of strained layer superlattices over the first gallium arsenide layer.

19. The method of claim 16 wherein the superlattice has an asymetric distribution of strain.

20. The method of claim 16 wherein the forming steps comprise organo metallic chemical vapor deposition.

* * * * *